(12) United States Patent  
Zhang et al.

(10) Patent No.: US 12,197,122 B2
(45) Date of Patent: Jan. 14, 2025

(54) COMPENSATION METHOD AND SYSTEM FOR EXPOSURE ALIGNMENT

(71) Applicant: CHANGXIN MEMORY TECHNOLOGIES, INC., Hefei (CN)

(72) Inventors: Sheng'an Zhang, Hefei (CN); Lei Zhao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 560 days.

(21) Appl. No.: 17/522,300

(22) Filed: Nov. 9, 2021

(65) Prior Publication Data

US 2022/0317558 A1  Oct. 6, 2022

Related U.S. Application Data

(63) Continuation of application No. PCT/CN2021/112707, filed on Aug. 16, 2021.

(30) Foreign Application Priority Data

Apr. 2, 2021 (CN) .......................... 202110362010.X

(51) Int. Cl.
*G03F 1/36* (2012.01)
(52) U.S. Cl.
CPC ........................ *G03F 1/36* (2013.01)
(58) Field of Classification Search
USPC .......................................................... 716/53
See application file for complete search history.

(56) References Cited

U.S. PATENT DOCUMENTS

| | | | |
|---|---|---|---|
| 6,590,657 | B1 | 7/2003 | Summerer |
| 7,434,197 | B1 | 10/2008 | Dolainsky |
| 7,568,180 | B2 | 7/2009 | Eisenmann |
| 2008/0295061 | A1 | 11/2008 | Eisenmann |

(Continued)

FOREIGN PATENT DOCUMENTS

| | | |
|---|---|---|
| CN | 1991586 A | 7/2007 |
| CN | 107431037 A | 12/2017 |
| CN | 107490931 A | 12/2017 |

(Continued)

OTHER PUBLICATIONS

First Office Action of the Chinese application No. 202110362010.X, issued on Feb. 23, 2022, 18 pgs.

*Primary Examiner* — Bryce M Aisaka
(74) *Attorney, Agent, or Firm* — Syncoda LLC; Feng Ma

(57) ABSTRACT

A compensation method and system for exposure alignment are provided. The method includes: acquiring original data of an aligned pattern, performing first-order processing on the original data to obtain first-order derivative data, obtaining a compensation value based on the original data and the first-order derivative data when exposure alignment has deviation, and compensating the exposure alignment based on the compensation value. According to the compensation method for exposure alignment, the first-order derivative data is obtained by performing first-order processing on the original data, and then the compensation value is obtained based on the original data and the first-order derivative data to compensate the exposure alignment, so that the compensation accuracy is higher, and the accuracy of exposure alignment is optimized.

19 Claims, 3 Drawing Sheets

(56) References Cited

U.S. PATENT DOCUMENTS

2020/0371441 A1\* 11/2020 Tel ..................... G03F 7/70633
2021/0132509 A1    5/2021 Huisman et al.

FOREIGN PATENT DOCUMENTS

| CN | 105204299 B   | 6/2018  |
|----|---------------|---------|
| CN | 110235061 A   | 9/2019  |
| CN | 111007702 A   | 4/2020  |
| CN | 112020677 A   | 12/2020 |
| CN | 113093485 A   | 7/2021  |
| WO | 2020038642 A1 | 2/2020  |

\* cited by examiner

COMPENSATION METHOD AND SYSTEM FOR EXPOSURE ALIGNMENT

CROSS-REFERENCE TO RELATED APPLICATIONS

This application is a continuation application of International Patent Application No. PCT/CN2021/112707, filed on Aug. 16, 2021, which claims priority to Chinese Patent Application No. 202110362010.X, filed on Apr. 2, 2021 and entitled "Compensation method and system for exposure alignment". The contents of International Patent Application No. PCT/CN2021/112707 and Chinese Patent Application No. 202110362010.X are incorporated herein by reference in their entireties.

TECHNICAL FIELD

The disclosure relates to a compensation method and system for exposure alignment.

BACKGROUND

With the gradual development of semiconductor technology, preparation of a fine pattern requires higher accuracy of exposure alignment. However, current manufacturers of exposure devices have corresponding indexes to reflect the image intensity of an aligned pattern.

SUMMARY

A first aspect of the disclosure provides a compensation method for exposure alignment, which may include: acquiring original data of an aligned pattern; performing derivative processing on the original data to obtain derivative data; obtaining a compensation value based on the original data and the derivative data when exposure alignment has deviation; and compensating the exposure alignment based on the compensation value.

A second aspect of the disclosure provides a compensation system for exposure alignment, which may include: a data collector, configured to acquire original data of an aligned pattern; a processor, which is connected with the data collector and configured to perform derivative processing on the original data to obtain derivative data; and a compensator, which is connected with the processor and configured to obtain a compensation value based on the original data and the derivative data when exposure alignment has deviation, and compensate the exposure alignment based on the compensation value.

Details of one or more embodiments of the disclosure are provided in the following drawings and descriptions. Other features and advantages of the disclosure will become apparent from the specification, drawings, and claims.

BRIEF DESCRIPTION OF THE DRAWINGS

In order to more clearly explain the technical solutions in the embodiments of this application or in a traditional technology, the drawings required in the descriptions of the embodiments or the traditional technology will be briefly introduced below. It is apparent that the drawings in the following descriptions are only some embodiments of this application. Those of ordinary skill in the art may also obtain other drawings in accordance with these drawings without paying creative labor.

DETAILED DESCRIPTION

There is no corresponding technology for monitoring deformation of an aligned pattern caused by processes such as etching and chemical mechanical polishing and for how to compensate and correct after deformation, therefore, the accuracy of current exposure alignment is very low.

In order to facilitate understanding of the disclosure, the disclosure will be described more comprehensively below with reference to relevant drawings. Preferred embodiments of the disclosure are given in attached drawings. However, the disclosure may be implemented in many different ways and is not limited to the embodiments described herein. On the contrary, these embodiments are provided for the purpose of making the disclosure more thorough and comprehensive.

Unless otherwise defined, all technological and scientific terms used in the disclosure have meanings the same as those usually understood by those skilled in the art. Terms used in the description of the disclosure are only adopted to describe the purpose of the specific embodiments and not intended to limit the disclosure. The terms "and/or" as used herein include any and all combinations of one or more related listed items.

In the descriptions of the disclosure, it is to be understood that the orientation or location relationships indicated by the terms "upper", "lower", "vertical", "horizontal", "inner" and "outer" are methods or location relationships shown on the basis of the drawings, which are only for convenience of describing the disclosure and simplifying the descriptions, rather than indicating or implying that the referred apparatuses or elements must have a specific orientation or must be constructed and operated in the specific orientation. Therefore, it cannot be understood as a limitation to the disclosure.

Figure 1:
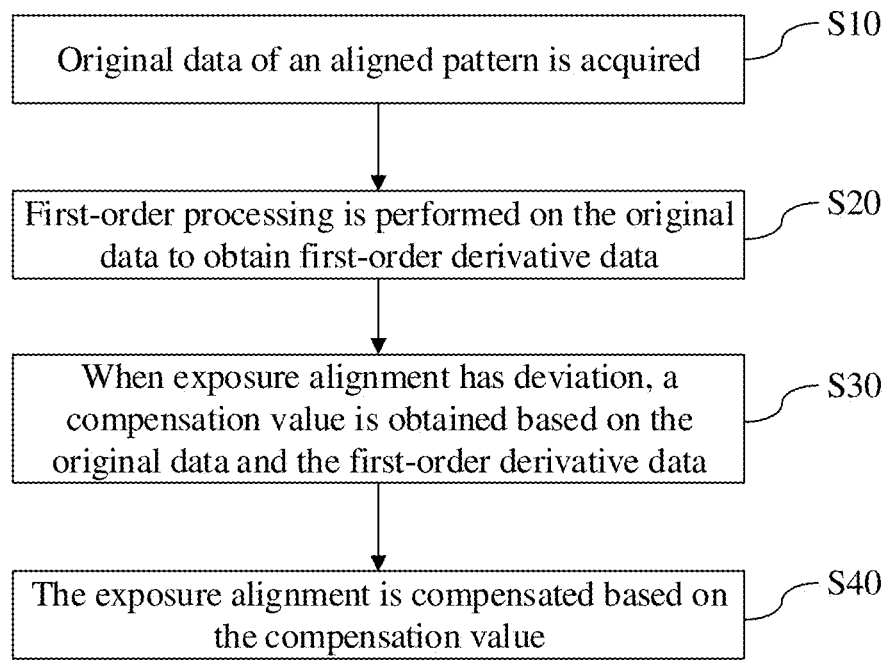
FIG. 1 is a flowchart of a compensation method for exposure alignment provided by the disclosure.

FIG. 1 is a flowchart of a compensation method for exposure alignment provided in the disclosure, which may include the following operations.

At S10, original data of an aligned pattern is acquired.

At S20, derivative processing is performed on the original data to obtain first-order derivative data.

At S30, when exposure alignment has deviation, a compensation value is obtained based on the original data and the first-order derivative data.

At S40, the exposure alignment is compensated based on the compensation value.

According to the compensation method for exposure alignment in the disclosure, the first-order derivative data may be obtained by performing first-order processing on the original data, and then the compensation value may be obtained based on the original data and the first-order derivative data to compensate exposure alignment deviation caused by deformation of an aligned pattern, so that the compensation accuracy can be higher, and the accuracy of exposure alignment is improved.

As an example, the original data in S10 may be obtained through measurement when the aligned pattern is subjected to exposure alignment. Specific original data may include data of all points in the aligned pattern.

As an example, the original data of each point of the aligned pattern and the first-order derivative data of the each point after first-order processing may all be vectors.

As an example, S30 may include the following operations.

At S301, the original data is split into an X component and a Y component to obtain first data.

At S302, the first-order derivative data after the first-order processing is split into an X-direction component and a Y-direction component to obtain second data.

At S303, a compensation value is obtained based on the first data and the second data.

A 6-parameter model may be taken as an example. The compensation value may be obtained based on the original data and second-order derivative data. Specifically, the operation of performing derivative processing on the original data to obtain the derivative data may include that first-order derivation is performed on the original data to obtain the first-order derivative data as the derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with the center of a wafer as the origin, and a coordinate CFY of the original data in the Y direction in the coordinate system with the center of the wafer as the origin.

The second data may include: a translation amount TRX' of the first-order derivative data in the X direction, a translation amount TRY of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data in the Y direction, a coordinate CFX' of the first-order derivative data in the X direction in a coordinate system with the center of a wafer as the origin, and a coordinate CFY' of the first-order derivative data in the Y direction in the coordinate system with the center of the wafer as the origin.

As an example, S303 may include the following operations.

At S3031, an offset Shift X of the original data in the X direction, an offset Shift Y of the original data in the Y direction, an offset Shift X' of the first-order derivative data in the X direction and an offset Shift Y' of the first-order derivative data in the Y direction are respectively obtained based on the following formulas (formula (1) to formula (4)).

$$\text{Shift\_}X=(TRX)+(-GRX^*CFY)+(-NOGR^*CFY)+(GMX^*CFX); \quad (1)$$

$$\text{Shift\_}Y=(TRY)+(GRX^*CFX)+(GMY^*CFY); \quad (2)$$

$$\text{Shift\_}X'=(TRX')+(-GRX'^*CFY')+(-NOGR'^*CFY')+(GMX'^*CFX'); \quad (3) \text{ and}$$

$$\text{Shift\_}Y'=(TRY')+(GRX'^*CFX')+(GMY'^*CFY'). \quad (4)$$

At S3032, a total offset in the X direction is obtained based on the offset Shift X of the original data in the X direction and the offset Shift X' of the first-order derivative data in the X direction, and a total offset in the Y direction is obtained based on the offset Shift Y of the original data in the Y direction and the offset Shift Y' of the first-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction and the offset Shift X' of the first-order derivative data in the X direction, and the total offset in the Y direction can be obtained by adding the offset Shift Y of the original data in the Y direction and the offset Shift Y' of the first-order derivative data in the Y direction.

In another example, a 6-parameter model is still as an example. The compensation value may be obtained based on the original data and second-order derivative data. Specifically, the operation of performing derivative processing on the original data to obtain the derivative data may include that first-order derivation is performed on the original data to obtain the first-order derivative data, and second-order derivation is performed on the first-order derivative data to obtain the second-order derivative data as the derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with the center of a wafer as the origin, and a coordinate CFY of the original data in the Y direction in the coordinate system with the center of the wafer as the origin.

The second data may include: a translation amount TRX' of the second-order derivative data in the X direction, a translation amount TRY' of the second-order derivative data in the Y direction, a rotation amount GRX' of the second-order derivative data, an orthogonal amount NOGR' of the second-order derivative data, an amplification amount GMX' of the second-order derivative data in the X direction, an amplification amount GMY' of the second-order derivative data in the Y direction, a coordinate CFX' of the second-order derivative data in the X direction in a coordinate system with the center of a wafer as the origin, and a coordinate CFY' of the second-order derivative data in the Y direction in the coordinate system with the center of the wafer as the origin.

As an example, S303 may include the following operations.

At S3031, the operation that the compensation value is obtained based on the first data and the second data includes that an offset Shift X of the original data in the X direction, offset Shift Y of the original data in the Y direction, an offset Shift X' of the second-order derivative data in the X direction and an offset Shift Y' of the second-order derivative data in the Y direction are respectively obtained based on formula (5) to formula (8).

$$\text{Shift\_}X=(TRX)+(-GRX^*CFY)+(-NOGR^*CFY)+(GMX^*CFX); \quad (5)$$

$$\text{Shift\_}Y=(TRY)+(GRX^*CFX)+(GMY^*CFY); \quad (6)$$

$$\text{Shift\_}X''=(TRX'')+(-GRX''*CFY'')+(-NOGR''*CFY'')+(GMX''*CFX''); \quad (7) \text{ and}$$

$$\text{Shift\_}Y''=(TRY'')+(GRX''*CFX'')+(GMY''*CFY''). \quad (8)$$

At S3032, a total offset in the X direction is obtained based on the offset Shift X of the original data in the X direction and the offset Shift X' of the second-order derivative data in the X direction, and a total offset in the Y direction is obtained based on the offset Shift Y of the original data in the Y direction and the offset Shift Y' of the second-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction and the offset Shift X' of the second-order derivative data in the X direction, and the total offset in the Y direction can be obtained by adding the offset Shift Y of the original data in the Y direction and the offset Shift Y' of the second-order derivative data in the Y direction.

In yet another example, a 6-parameter model is still taken as an example. The compensation value may be obtained based on the original data, the first-order derivative data and the second-order derivative data. Specifically, the operation of performing derivative processing on the original data to obtain the derivative data may include that first-order derivation is performed on the original data to obtain the first-order derivative data, and second-order derivation is performed on the first-order derivative data to obtain the second-order derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with the center of a wafer as the origin, and a coordinate CFY of the original data in the Y direction in the coordinate system with the center of the wafer as the origin.

The second data may include: a translation amount TRX' of the first-order derivative data in the X direction, a translation amount TRY of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data in the Y direction, a coordinate CFX' of the first-order derivative data in the X direction in the coordinate system with the center of the wafer as the origin, a coordinate CFY' of the first-order derivative data in the Y direction in the coordinate system with the center of the wafer as the origin, a translation amount TRX' of the second-order derivative data in the X direction, a translation amount TRY' of the second-order derivative data in the Y direction, a rotation amount GRX' of the second-order derivative data, an orthogonal amount NOGR" of the second-order derivative data, an amplification amount GMX" of the second-order derivative data in the X direction, an amplification amount GMY" of the second-order derivative data in the Y direction, a coordinate CFX" of the second-order derivative data in the X direction in the coordinate system with the center of the wafer as the origin, and a coordinate CFY" of the second-order derivative data in the Y direction in the coordinate system with the center of the wafer as the origin.

As an example, S303 may include the following operations.

At S3031, an offset Shift X of the original data in the X direction, an offset Shift Y of the original data in the Y direction, the offset Shift X' of the first-order derivative data in the X direction, an offset Shift Y' of the first-order derivative data in the Y direction, the offset Shift X" of the second-order derivative data in the X direction, and an offset Shift Y" of the second-order derivative data in the Y direction are respectively obtained based on formula (9) to formula (14).

$$\text{Shift\_}X=(TRX)+(-GRX*CFY)+(-NOGR*CFY)+(GMX*CFX); \quad (9)$$

$$\text{Shift\_}Y=(TRY)+(GRX*CFX)+(GMY*CFY); \quad (10)$$

$$\text{Shift\_}X'=(TRX')+(-GRX'*CFY')+(-NOGR'*CFY')+(GMX'*CFX'); \quad (11)$$

$$\text{Shift\_}Y'=(TRY')+(GRX'*CFX')+(GMY'*CFY'); \quad (12)$$

$$\text{Shift\_}X''=(TRX'')+(-GRX''*CFY'')+(-NOGR''*CFY'')+(GMX''*CFX''); \quad (13) \text{ and}$$

$$\text{Shift\_}Y''=(TRY'')+(GRX''*CFX'')+(GMY''*CFY''). \quad (14)$$

At S3032, a total offset in the X direction is obtained based on the offset Shift X of the original data in the X direction, the offset Shift X' of the first-order derivative data in the X direction, and the offset Shift X" of the second-order derivative data in the X direction; and a total offset in the Y direction is obtained based on the offset Shift Y of the original data in the Y direction, the offset Shift Y' of the first-order derivative data in the Y direction, and the offset Shift Y" of the second-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction, the offset Shift X' of the first-order derivative data in the X direction, and the offset Shift X" of the second-order derivative data in the X direction; and the total offset in the Y direction can be obtained by adding the offset Shift Y of the original data in the Y direction, the offset Shift Y' of the first-order derivative data in the Y direction, and the offset Shift Y" of the second-order derivative data in the Y direction.

In an example, a 10-parameter model is taken as an example. The compensation value may be obtained based on the original data and the first-order derivative data. The operation of performing derivative processing on the original data to obtain the derivative data may include that first-order derivation is performed on the original data to obtain the first-order derivative data as the derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with the center of a wafer as the origin, a coordinate CFY of the original data in the Y direction in the coordinate system with the center of the wafer as the origin, an amplification amount FM of an exposure area of the original data, an amplification amount AFM of an asymmetric exposure area of the original data, a rotation amount FR of the exposure area of the original data, the rotation amount AFR of the asymmetric exposure area of the original data, a coordinate IFX of the original data in the X direction in a coordinate system with the center of the exposure area as the origin, and a coordinate IFY of the original data in the Y direction in the coordinate system with the center of the exposure area as the origin.

The second data may include: a translation amount TRX' of the first-order derivative data in the X direction, a translation amount TRY of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data in the Y direction, a coordinate CFX' of the first-order derivative data in the X direction in the coordinate system with the center of the wafer as the origin, a coordinate CFY' of the first-order derivative data in the Y direction in the coordinate system with the center of the wafer as the origin, an amplification amount FM' of an exposure area of the first-order derivative data, an amplification amount AFM' of an asymmetric exposure area of the first-order derivative data, a rotation amount FR' of the exposure area of the first-order derivative data, a rotation amount AFR' of the asymmetric exposure area of the first-order derivative data, a coordinate IFX' of the first-order derivative data in the X direction in the coordinate system with the center of the exposure area as the origin, and a coordinate IFY' of the first-order derivative data in the Y direction in the coordinate system with the center of the exposure area as the origin.

As an example, S303 may include the following operations.

At S3031, an offset Shift X of the original data in the X direction, an offset Shift Y of the original data in the Y direction, an offset Shift X' of the first-order derivative data in the X direction and an offset Shift Y' of the first-order derivative data in the Y direction are respectively obtained based on the following formulas (formula (15) to formula (18)).

$$\text{Shift\_}X = (TRX) + (-GRX*CFY) + (-NOGR*CFY) + (GMX*CFX) + (FM*IFX) + (AFM*IFX) + (-FR*IFY) + (-AIR*IFY); \quad (15)$$

$$\text{Shift\_}Y = (TRY) + (GRX*CFX) + (GMY*CFY) + (FM*IFY) + (-AFM*IFY) + (FR*IFX) + (-AFR*IFX); \quad (16)$$

$$\text{Shift\_}X' = (TRX') + (-GRX'*CFY') + (-NOGR'*CFY') + (GMX'*CFX') + (FM'*IFX') + (AFM'*IFX') + (-FR'*IFY') + (-AFR'*IFY'); \quad (17) \text{ and}$$

$$\text{Shift\_}Y' = (TRY') + (GRX'*CFX') + (GMY'*CFY') + (FM'*IFY') + (-AFM'*IFY') + (FR'*IFX') + (-AFR'*IFX'). \quad (18)$$

At S3032, a total offset in the X direction is obtained based on the offset Shift X of the original data in the X direction and the offset Shift X' of the first-order derivative data in the X direction, and a total offset in the Y direction is obtained based on the offset Shift Y of the original data in the Y direction and the offset Shift Y' of the first-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction and the offset Shift X' of the first-order derivative data in the X direction, and the total offset in the Y direction can be obtained by adding the offset Shift Y of the original data in the Y direction and the offset Shift Y' of the first-order derivative data in the Y direction.

In an example, a 10-parameter model is still taken as an example. The compensation value may be obtained based on the original data and the second-order derivative data. The operation of performing derivative processing on the original data to obtain the derivative data may include that first-order derivation is performed on the original data to obtain the first-order derivative data, and second-order derivation is performed on the first-order derivative data to obtain the second-order derivative data as the derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with the center of a wafer as the origin, a coordinate CFY of the original data in the Y direction in the coordinate system with the center of the wafer as the origin, an amplification amount FM of an exposure area of the original data, an amplification amount AFM of an asymmetric exposure area of the original data, a rotation amount FR of the exposure area of the original data, a rotation amount AFR of the asymmetric exposure area of the original data, a coordinate IFX of the original data in the X direction in a coordinate system with the center of the exposure area as the origin, and a coordinate IFY of the original data in the Y direction in the coordinate system with the center of the exposure area as the origin.

The second data may include: a translation amount TRX" of the second-order derivative data in the X direction, a translation amount TRY" of the second-order derivative data in the Y direction, a rotation amount GRX" of the second-order derivative data, an orthogonal amount NOGR" of the second-order derivative data, an amplification amount GMX" of the second-order derivative data in the X direction, an amplification amount GMY" of the second-order derivative data in the Y direction, a coordinate CFX" of the second-order derivative data in the X direction in the coordinate system with the center of the wafer as the origin, a coordinate CFY" of the second-order derivative data in the Y direction in the coordinate system with the center of the wafer as the origin, an amplification amount FM" of an exposure area of the second-order derivative data, an amplification amount AFM" of an asymmetric exposure area of the second-order derivative data, a rotation amount FR" of the exposure area of the second-order derivative data, a rotation amount AFR" of the asymmetric exposure area of the second-order derivative data, a coordinate IFX" of the second-order derivative data in the X direction in a coordinate system with the center of the exposure area as the origin, and a coordinate IFY" of the second-order derivative data in the Y direction in the coordinate system with the center of the exposure area as the origin.

As an example, S303 may include the following operations.

At S3031, an offset Shift X of the original data in the X direction, an offset Shift Y of the original data in the Y direction, an offset Shift X" of the second-order derivative data in the X direction and an offset Shift Y" of the second-order derivative data in the Y direction are respectively obtained based on the following formulas (formula (19) to formula (22)).

$$\text{Shift\_}X=(TRX)+(-GRX*CFY)+(-NOGR*CFY)+ \\ (GMX*CFX)+(FM*IFX)+(AFM*IFX)+(- \\ FR*IFY)+(-AFR*IFY); \quad (19)$$

$$\text{Shift\_}Y=(TRY)+(GRX*CFX)+(GMY*CFY)+ \\ (FM*IFY)+(-AFM*IFY)+(FR*IFX)+(- \\ AFR*IFX); \quad (20)$$

$$\text{Shift\_}X''=(TRX'')+(-GRX''*CFY'')+(- \\ NOGR''*CFY'')+(GMX''*CFX'')+(FM''*IFX'')+ \\ (AFM''*IFX'')+(-FR''*IFY'')+(-AFR''*IFY''); \quad (21) \text{ and}$$

$$\text{Shift\_}Y''=(TRY'')+(GRX''*CFX'')+(GMY''*CFY'')+ \\ (FM''*IFY'')+(-AFM''*IFY'')+(FR''*IFX'')+(- \\ AFR''*IFX''). \quad (22)$$

At S3032, a total offset in the X direction is obtained based on the offset Shift X of the original data in the X direction and the offset Shift of the second-order derivative data in the X direction, and a total offset in the Y direction is obtained based on the offset Shift Y of the original data in the Y direction and the offset Shift Y" of the second-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction and the offset Shift X" of the second-order derivative data in the X direction, and the total offset in the Y direction can be obtained by adding the offset Shift Y of the original data in the Y direction and the offset Shift Y" of the second-order derivative data in the Y direction.

In an example, a 10-parameter model is still taken as an example. The compensation value may be obtained based on the original data, the first-order derivative data and the second-order derivative data. Specifically, the operation of performing derivative processing on the original data to obtain the derivative data may include that first-order derivation is performed on the original data to obtain the first-order derivative data, and second-order derivation is performed on the first-order derivative data to obtain the second-order derivative data.

The first data may include: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in the coordinate system with the center of the wafer as the origin, a coordinate CFY of the original data in the Y direction in the coordinate system with the center of a wafer as the origin, an amplification amount FM of an exposure area of the original data, an amplification amount AFM of an asymmetric exposure area of the original data, a rotation amount FR of the exposure area of the original data, a rotation amount AFR of the asymmetric exposure area of the original data, a coordinate IFX of the original data in the X direction in a coordinate system with the center of the exposure area as the origin, and a coordinate IFY of the original data in the Y direction in the coordinate system with the center of the exposure area as the origin.

The second data may include: a translation amount TRX' of the first-order derivative data in the X direction, a translation amount TRY of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data, a coordinate CFX' of the first-order derivative data in the X direction in the coordinate system with the center of the wafer as the origin, a coordinate CFY' of the first-order derivative data in the Y direction in the coordinate system with the center of the wafer as the origin, an amplification amount FM' of an exposure area of the first-order derivative data, an amplification amount AFM' of an asymmetric exposure area of the first-order derivative data, a rotation amount FR' of the exposure area of the first-order derivative data, a rotation amount AFR' of the asymmetric exposure area of the first-order derivative data, a coordinate IFX' of the first-order derivative data in the X direction in a coordinate system with the center of the exposure area as the origin, a coordinate IFY' of the first-order derivative data in the Y direction in the coordinate system with the center of the exposure area as the origin, a translation amount TRX" of the second-order derivative data in the X direction, a translation amount TRY" of the second-order derivative data in the Y direction, a rotation amount GRX" of the second-order derivative data, an orthogonal amount NOGR" of the second-order derivative data, an amplification amount GMX" of the second-order derivative data in the X direction, an amplification amount GMY" of the second-order derivative data in the Y direction, a coordinate amount CFX" of the second-order derivative data in the X direction in the coordinate system with the center of the wafer as the origin, a coordinate amount CFY" of the second-order derivative data in the Y direction in the coordinate system with the center of the wafer as the origin, an amplification amount FM" of an exposure area of the second-order derivative data, an amplification amount AFM" of an asymmetric exposure area of the second-order derivative data, a rotation amount FR" of the exposure area of the second-order derivative data, a rotation amount AFR" of the asymmetric exposure area of the second-order derivative data, a coordinate IFX" of the second-order derivative data in the X direction in a coordinate system with the center of the exposure area as the origin, and a coordinate amount IFY" of the second-order derivative data in the Y direction in the coordinate system with the center of the exposure area as the origin.

As an example, S303 may include the following operations.

At S3031, an offset Shift X of the original data in the X direction, an offset Shift Y of the original data in the Y direction, an offset Shift X' of the first-order derivative data in the X direction, an offset Shift Y of the first-order derivative data in the Y direction, the offset Shift X" of the second-order derivative data in the X direction, and an offset Shift Y" of the second-order derivative data in the Y direction are respectively obtained based on the following formulas (formula (22) to formula (27).

$$\text{Shift\_}X=(TRX)+(-GRX*CFY)+(-NOGR*CFY)+ \\ (GMX*CFX)+(FM*IFX)+(AFM*IFX)+(- \\ FR*IFY)+(-AFR*IFY); \quad (22)$$

$$\begin{aligned}\text{Shift\_Y}=&(TRY)+(GRX*CFX)+(GMY*CFY)+\\&(FM*IFY)+(-AFM*IFY)+(FR*IFX)+(-\\&AFR*IFX);\end{aligned} \quad (23)$$

$$\begin{aligned}\text{Shift\_X'}=&(TRX')+(-GRX'*CFY')+(-NOGR'*CFY')+\\&(GMX'*CFX')+(FM'*IFX')+(AFM'*IFX')+(-\\&FR'*IFY')+(-AFR'*IFY');\end{aligned} \quad (24)$$

$$\begin{aligned}\text{Shift\_Y'}=&(TRY')+(GRX'*CFX')+(GMY'*CFY')+\\&(FM'*IFY')+(-AFM'*IFY')+(FR'*IFX')+(-\\&AFR'*IFX');\end{aligned} \quad (25)$$

$$\begin{aligned}\text{Shift\_X''}=&(TRX'')+(-GRX''*CFY'')+(-\\&NOGR''*CFY'')+(GMX''*CFX'')+(FM''*IFX'')+\\&(AFM''*IFX'')+(-FR''*IFY'')+(-AFR''*IFY'');\end{aligned} \quad (26) \text{ and}$$

$$\begin{aligned}\text{Shift\_Y''}=&(TRY'')+(GRX''*CFX'')+(GMY''*CFY'')+\\&(FM''*IFY'')+(-AFM''*IFY'')+(FR''*IFX'')+(-\\&AFR''*IFX'').\end{aligned} \quad (27)$$

At S3032, a total offset in the X direction is obtained based on the offset Shift X of the original data in the X direction, the offset Shift X' of the first-order derivative data in the X direction, and the offset Shift X" of the second-order derivative data in the X direction; and a total offset in the Y direction is obtained based on the offset Shift Y of the original data in the Y direction, the offset Shift Y' of the first-order derivative data in the Y direction, and the offset Shift Y" of the second-order derivative data in the Y direction.

At S3033, the compensation value is obtained based on the total offset in the X direction and the total offset in the Y direction.

Specifically, the total offset in the X direction can be obtained by adding the offset Shift X of the original data in the X direction, the offset Shift X' of the first-order derivative data in the X direction, and the offset Shift X" of the second-order derivative data in the X direction; and the total offset in the Y direction can be obtained by adding the offset Shift Y of the original data in the Y direction, the offset Shift Y' of the first-order derivative data in the Y direction, and the offset Shift Y" of the second-order derivative data in the Y direction.

Figure 2:
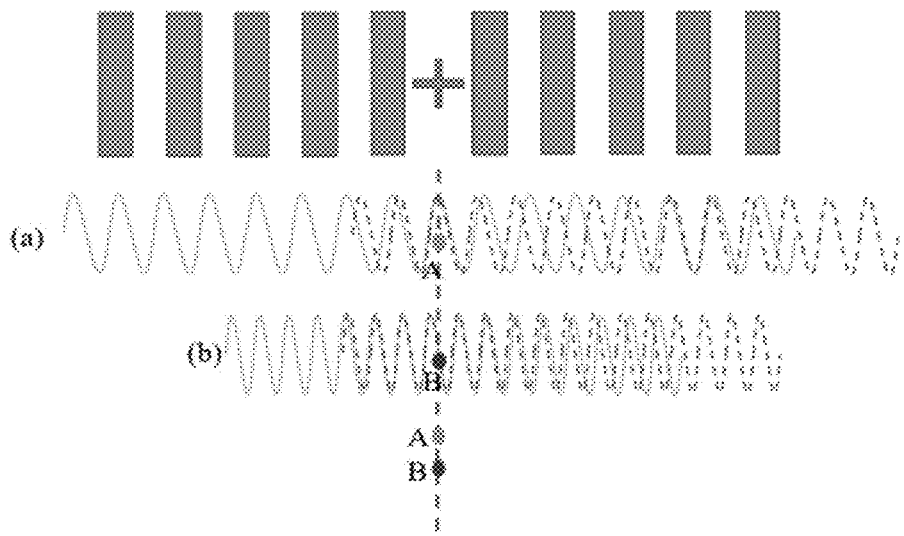
FIG. 2 is a schematic diagram of an aligned pattern without deformation.
Figure 3:
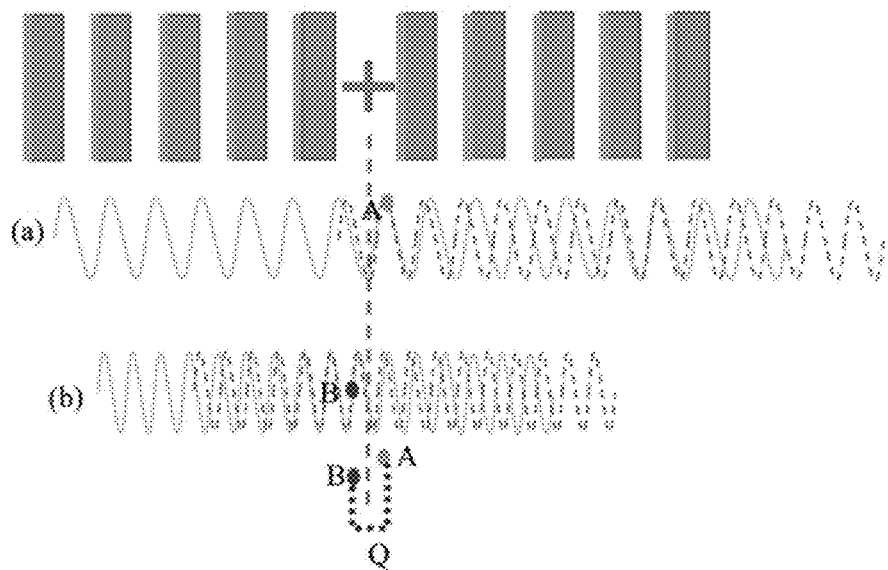
FIG. 3 is a schematic diagram of an aligned pattern with deformation.

As an example, as shown in FIG. 2 and FIG. 3, the original data includes a first sine wave and a second sine wave. As shown in sine waves(a) in FIG. 2 and FIG. 3, a solid sine wave in the sine waves (a) is the first sine wave, and a dashed sine wave is the second sine wave. The first sine wave and the second sine wave have a unique first coincidence point A, and the first coincidence point A corresponds to the waveform center of the aligned pattern in the original data. The first-order derivative data includes a third sine wave and a fourth sine wave. As shown in sine waves(b) in FIG. 2 and FIG. 3, the solid sine wave in the sine waves (a) is the third sine wave, and the dashed sine wave is the fourth sine wave. The third sine wave and the fourth sine wave have a unique second coincidence point B, and the second coincidence point B corresponds to the waveform center of the aligned pattern in the first-order derivative data. After the first-order derivative data is obtained, the following operations are further included.

Whether the first coincidence point A and the second coincidence point B have a horizontal offset is determined so as to determine whether the aligned pattern has deformation or abnormality and realize real-time monitoring of the deformation of the aligned pattern. The deformation amount of the aligned pattern may be calculated based on the original data and the first-order derivative data, and quantitative compensation may be performed, thereby eliminating an impact of the deformation of the aligned pattern on exposure alignment. When the first coincidence point A and the second coincidence point B have the horizontal offset, it can be determined that the aligned pattern is deformed. As shown in FIG. 3, when the first coincidence point A and the second coincidence point B have the horizontal offset Q, the aligned pattern in FIG. 3 is deformed. At the same time, the deformation amount of the aligned pattern and an impact of the deformation amount of the aligned pattern on the exposure alignment may be determined according to the horizontal offset Q. When the first coincidence point A and the second coincidence point B in the FIG. 2 have no horizontal deviation, the aligned pattern in FIG. 2 is not deformed, and therefore, it can be determined that the deviation of the exposure alignment does not include the deviation caused by deformation of the aligned pattern.

As an example, the operation that the compensation value is obtained based on the original data and the first-order derivative data may include that:

the second data is multiplied by a correction coefficient for correction; and a corrected compensation value is obtained based on the first data and the corrected second data.

As an example, the correction coefficient may include 0.5 to 1, and specifically, the correction coefficient may include 0.5, 0.6, 0.7, 0.8, 0.9 or 1.

As an example, after the exposure alignment is compensated based on the corrected compensation value, an operation that the compensated aligned pattern is verified may be also included. The operation that the exposure alignment of the compensated aligned pattern is verified may include:

overlay alignment measurement is performed on the aligned pattern that has been compensated based on the corrected compensation value; and it is determined that a current corrected compensation value meets a requirement when an overlay alignment error value of the compensated aligned pattern is smaller than a preset value, compared with an overlay alignment error value of the aligned pattern of a previous batch of wafers.

As an example, after determining whether the exposure alignment of the compensated aligned pattern is accurate or not based on a result of the overlay alignment measurement, the following operation is further included.

When the overlay alignment error value of the compensated aligned pattern is greater than the preset value, the correction coefficient is adjusted.

It is to be noted that after the correction coefficient is adjusted, a step of verifying the compensated aligned pattern may also be included.

It is to be further noted that the method for verifying the exposure alignment of the compensated aligned pattern may also include that verification is performed by measuring electrical data and comparing the measured electrical data with target electrical data.

In another example, the disclosure further provides a compensation method for exposure alignment, which include that original data of an aligned pattern is acquired, derivative processing is performed on the original data to obtain first-order derivative data, second-order processing is performed on the first-order derivative data to obtain second-order derivative data, and a secondary compensation value is obtained based on the original data, the first-order derivative data and the second-order derivative data so as to compensate exposure alignment deviation caused by deformation of the aligned pattern. Therefore, the accuracy of the exposure alignment is further optimized.

Figure 4:
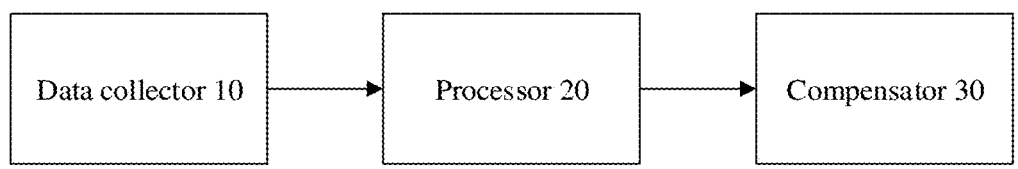
FIG. 4 is a structural block diagram of a compensation system for exposure alignment provided by the disclosure.

Referring to FIG. 4, the disclosure also provides a compensation system for exposure alignment, which includes: a data collector 10, configured to acquire original data of an aligned pattern; a processor 20, connected with the data collector 10 and configured to perform first-order processing on the original data to obtain first-order derivative data; a compensator 30, connected with the processor 20 and configured to obtain a compensation value based on the original data and the first-order derivative data when exposure alignment has deviation, and compensate exposure alignment deviation caused by deformation of the aligned pattern based on the compensation value. Therefore, the compensation accuracy can be higher and the accuracy of exposure alignment is optimized. Specifically, the compensator 30 may obtain the compensation value based on the original data and the first-order derivative data on the basis of the formulas in the compensation method for exposure alignment described in the above embodiments. For details, please refer to the foregoing contents, which will not be repeated here.

In an example, the processor 20 may also be configured to differentiate the first-order derivative data to obtain the second-order derivative data. The compensator 30 is also configured to obtain the compensation value based on the original data and the second-order derivative data, or obtain the compensation value based on the original data, the first-order derivative data and the second-order derivative data. For the acquisition manner for a compensation value, please refer to the foregoing contents, which are not repeated here.

Figure 5:
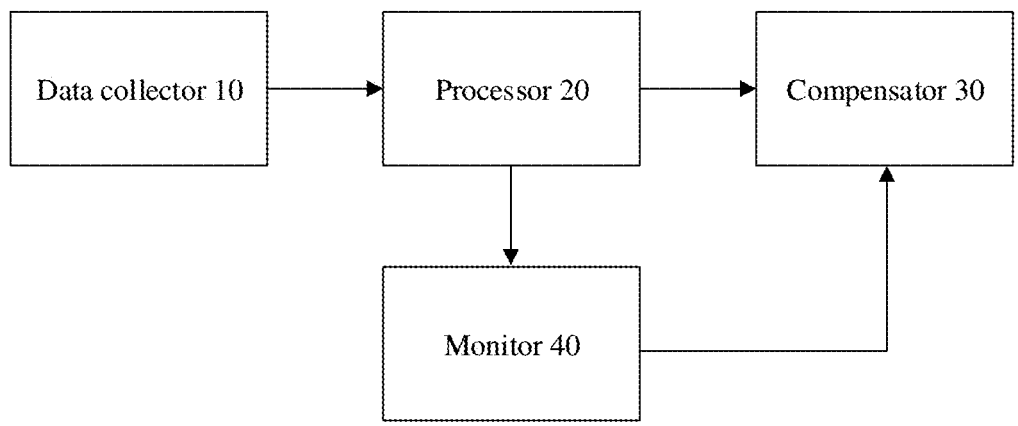
FIG. 5 is a structural block diagram of a compensation system for exposure alignment provided by the disclosure.

According to the compensation system for exposure alignment disclosed by the disclosure, the first-order derivative data may be obtained by performing first-order processing on the original data, and then the compensation value may be obtained based on the original data and the first-order derivative data to compensate the exposure alignment deviation caused by the deformation of the aligned pattern, so that quantitative compensation of the deformation of the aligned pattern to the exposure alignment can be realized, the compensation accuracy can be higher, and the accuracy of exposure alignment is optimized. As an example, as shown in FIG. 5, the compensation system for exposure alignment may further include a monitor 40. The monitor 40 is connected with the processor 20 and configured to determine whether the exposure alignment has deviation or not based on the original data and the first-order derivative data. Specifically, the monitor 40 may determine whether the first coincidence point A and the second coincidence point B have a horizontal offset based on determination as shown in FIG. 2 and FIG. 3, so as to realize real-time monitoring on whether the aligned pattern has alignment deformation or not. When the first coincidence point A and the second coincidence point B have the horizontal offset, it can be determined that the aligned pattern has the deformation. As shown in FIG. 3, when the first coincidence point A and the second coincidence point B have the horizontal offset Q, the aligned pattern in FIG. 3 can be determined to be deformed, meantime, the deformation amount of the aligned pattern and an impact of the deformation amount of the aligned pattern on the exposure alignment may be determined based on a magnitude of the horizontal offset Q. When the first coincidence point A and the second coincidence point B in the FIG. 2 have no horizontal deviation, the aligned pattern in FIG. 2 can be determined to be not deformed, and therefore, it is determined that the deviation of the exposure alignment does not include an impact of the deformation of the aligned pattern.

Figure 6:
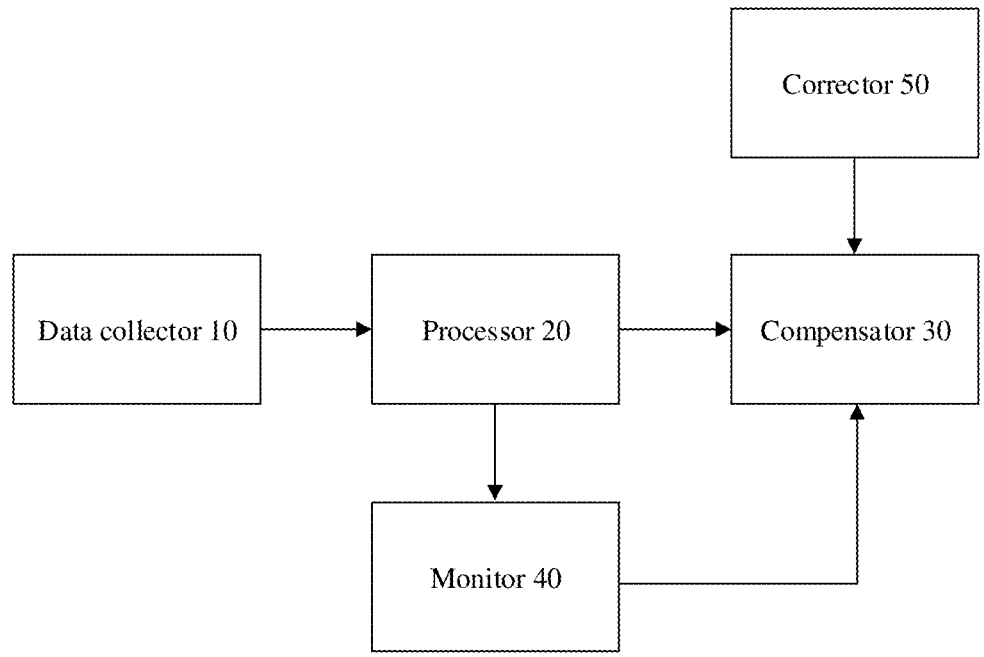
FIG. 6 is a structural block diagram of a compensation system for exposure alignment provided by the disclosure.

As an example, as shown in FIG. 6, the compensation system for exposure alignment may further include a corrector 50. The corrector 50 is connected with the compensator 30 and configured to provide a correction coefficient for the compensator 30. The compensator 30 is configured to compensate the exposure alignment based on the corrected compensation value. Specifically, the corrector 50 may employ the correction method in the above-mentioned compensation method for exposure alignment. For details, please refer to the above-mentioned contents about correction, which will not be repeated here.

Figure 7:
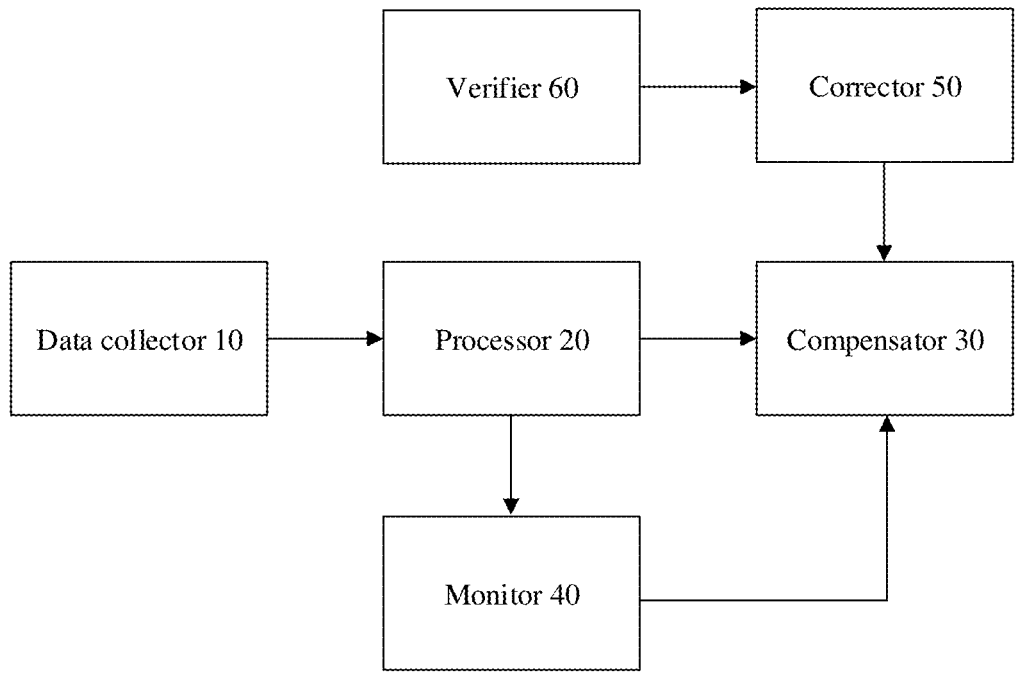
FIG. 7 is a structural block diagram of a compensation system for exposure alignment provided by the disclosure.

As an example, as shown in FIG. 7, the compensation system for exposure alignment may further include a verifier 60. The verifier 60 is connected with the corrector 50 and configured to verify the exposure alignment of the compensated aligned pattern and adjust the correction coefficient when an overlay alignment error of the compensated aligned pattern is greater than a preset value. Specifically, the verifier 60 may employ the verification method in the above-mentioned compensation method for exposure alignment. For details, please refer to the above-mentioned relevant contents, which will not be repeated here.

All the technical characteristics of the above embodiments may be combined arbitrarily. In order to make the descriptions concise, all possible combinations of the technical characteristics in the above embodiments have not been described. However, as long as there is no contradiction among the combinations of these technical characteristics, they shall be considered as the scope recorded in the specification.

The above embodiments only express several implementation manners of the disclosure, and their descriptions are more specific and detailed, but they cannot be understood as limiting the scope of the patent for the disclosure. It is to be pointed out that, for those of ordinary skill in the art, without departing from the concept of the disclosure, several modifications and improvements may also be made, which all fall within the scope of protection of the disclosure. Therefore, the scope of protection of the patent for the disclosure shall be subject to the scope of protection of the appended claims.

The invention claimed is:

1. A compensation method for exposure alignment, comprising:
    acquiring original data of an aligned pattern;
    performing derivative processing on the original data to obtain derivative data;
    obtaining a compensation value based on the original data and the derivative data when exposure alignment has deviation; and
    compensating the exposure alignment based on the compensation value;
    wherein the original data comprises a first sine wave and a second sine wave, the first sine wave and the second sine wave have a unique first coincidence point, and the first coincidence corresponds to a waveform center of the aligned pattern in the original data;
    the derivative data comprises a third sine wave and a fourth sine wave, the third sine wave and the fourth sine wave have a unique second coincidence point, and the second coincidence point corresponds to a waveform center of the aligned pattern in the derivative data;
    after obtaining the derivative data, the method further comprises:
    determining whether the first coincidence point and the second coincidence point have a horizontal offset, determining that the aligned pattern is deformed when the first coincidence point and the second coincidence point have the horizontal offset, and determining a deformation amount of the aligned pattern and an impact of the deformation amount of the aligned pattern on the exposure alignment based on a magnitude of the horizontal offset.

2. The compensation method for exposure alignment of claim 1, wherein both the original data of each point of the aligned pattern and the derivative data of the each point are vectors.

3. The compensation method for exposure alignment of claim 2, wherein obtaining the compensation value based on the original data and the derivative data comprises:
splitting the original data into an X component and a Y component to obtain first data;
splitting the derivative data into an X-direction component and a Y-direction component to obtain second data; and
obtaining the compensation value based on the first data and the second data.

4. The compensation method for exposure alignment of claim 3, wherein
performing derivative processing on the original data to obtain the derivative data comprises:
performing first-order derivation on the original data to obtain first-order derivative data as the derivative data,
wherein the first data comprises: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with a center of a wafer as an origin, and a coordinate CFY of the original data in the Y direction in the coordinate system with the center of the wafer as the origin, and
the second data comprises: a translation amount TRX' of the first-order derivative data in the X direction, a translation amount TRY' of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data in the Y direction, a coordinate CFX' of the first-order derivative data in the X direction in the coordinate system with the center of the wafer as the origin, and a coordinate CFY' of the first-order derivative data in the Y direction in the coordinate system with the center of the wafer as the origin; and
obtaining the compensation value based on the first data and the second data comprises:
respectively obtaining an offset Shift X of the original data in the X direction, an offset Shift Y of the original data in the Y direction, an offset Shift X' of the first-order derivative data in the X direction and an offset Shift Y' of the first-order derivative data in the Y direction based on following formulas:

Shift_X=(TRX)+(−GRX*CFY)+(−NOGR*CFY)+(GMX*CFX);

Shift_Y=(TRY)+(GRX*CFX)+(GMY*CFY);

Shift_X'=(TRX')+(−GRX'*CFY')+(−NOGR'*CFY')+(GMX'*CFX'); and

Shift_Y'=(TRY')+(GRX'*CFX')+(GMY'*CFY');

obtaining a total offset in the X direction based on the offset Shift X of the original data in the X direction and the offset Shift X' of the first-order derivative data in the X direction, and obtaining a total offset in the Y direction based on the offset Shift Y of the original data in the Y direction and the offset Shift Y' of the first-order derivative data in the Y direction; and
obtaining the compensation value based on the total offset in the X direction and the total offset in the Y direction.

5. The compensation method for exposure alignment of claim 4, wherein the original data comprises a first sine wave and a second sine wave, the first sine wave and the second sine wave having a unique first coincidence point; and the first-order derivative data comprises a third sine wave and a fourth sine wave, the third sine wave and the fourth sine wave having a unique second coincidence point;
the compensation method further comprises:
when the first coincidence point and the second coincidence point have a horizontal offset, determining that the aligned pattern is deformed; and
calculating a deformation amount of the aligned pattern based on the original data and the first-order derivative data and performing quantitative compensation.

6. The compensation method for exposure alignment of claim 5, wherein obtaining the compensation value based on the original data and the derivative data comprises:
multiplying the second data by a correction coefficient for correction; and
obtaining a corrected compensation value based on the first data and the corrected second data.

7. The compensation method for exposure alignment of claim 6, wherein the correction coefficient comprises 0.5-1.

8. The compensation method for exposure alignment of claim 6, further comprising:
verifying the exposure alignment of the compensated aligned pattern after compensating the exposure alignment based on the corrected compensation value;
wherein verifying the exposure alignment of the compensated aligned pattern comprises:
performing overlay alignment measurement on the aligned pattern that has been compensated based on the corrected compensation value; and
determining a current corrected compensation value meets a requirement in response to determining that an overlay alignment error value of the compensated aligned pattern is smaller than a preset value, compared with an overlay alignment error value of the aligned pattern of a previous batch of wafers.

9. The compensation method for exposure alignment of claim 8, wherein after determining whether the exposure alignment of the compensated aligned pattern is accurate or not based on a result of the overlay alignment measurement, the method further comprises:
adjusting the correction coefficient when the overlay alignment error value of the compensated aligned pattern is greater than the preset value.

10. The compensation method for exposure alignment of claim 3, wherein
performing derivative processing on the original data to obtain the derivative data comprises:
performing first-order derivation on the original data to obtain first-order derivative data as the derivative data, wherein the first data comprises: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with a center of a wafer as an origin, a coordinate CFY of the original data in the Y direction in the coordinate system with the center of the wafer as the origin, an amplification amount FM of an exposure area of the original data, an amplification amount AFM of an asymmetric exposure area of the original data, a rotation amount FR of the exposure area of the original data, a rotation amount AFR of the asymmetric exposure area of the original data, a coordinate IFX of the original data in the X direction in a coordinate system with a center of the exposure area as an origin, and a coordinate IFY of the original data in the Y direction in the coordinate system with the center of the exposure area as the origin, and the second data comprises: a translation amount TRX' of the first-order derivative data in the X direction, a translation amount TRY' of the first-order derivative data in the Y direction, a rotation amount GRX' of the first-order derivative data, an orthogonal amount NOGR' of the first-order derivative data, an amplification amount GMX' of the first-order derivative data in the X direction, an amplification amount GMY' of the first-order derivative data in the Y direction, a coordinate CFX' of the first-order derivative data in the X direction in the coordinate system with the center of the wafer as the origin, a coordinate CFY' of the first-order derivative data in the Y direction in the coordinate system with the center of the wafer as the origin, an amplification amount FM' of an exposure area of the first-order derivative data, an amplification amount AFM' of an asymmetric exposure area of the first-order derivative data, a rotation amount FR' of the exposure area of the first-order derivative data, a rotation amount AFR' of the asymmetric exposure area of the first-order derivative data, a coordinate IFX' of the first-order derivative data in the X direction in a coordinate system with a center of the exposure area as an origin, and a coordinate IFY' of the first-order derivative data in the Y direction in the coordinate system with the center of the exposure area as the origin; and obtaining the compensation value based on the first data and the second data comprises:

respectively obtaining an offset Shift X of the original data in the X direction, an offset Shift Y of the original data in the Y direction, an offset Shift X' of the first-order derivative data in the X direction and an offset Shift Y' of the first-order derivative data in the Y direction based on following formulas:

Shift_X=(TRX)+(−GRX*CFY)+(−NOGR*CFY)+(GMX*CFX)+(FM*IFX)+(AFM*IFX)+(−FR*IFY)+(−AFR*IFY);

Shift_Y=(TRY)+(GRX*CFX)+(GMY*CFY)+(FM*IFY)+(−AFM*IFY)+(FR*IFX)+(−AFR*IFX);

Shift_X'=(TRX')+(−GRX'*CFY')+(−NOGR'*CFY')+(GMX'*CFX')+(FM'*IFX')+(AFM'*IFX')+(−FR'*IFY')+(−AFR'*IFY'); and Shift_Y'=(TRY')+(GRX'*CFX')+(GMY'*CFY')+(FM'*IFY')+(−AFM'*IFY')+(FR'*IFX')+(−AFR'*IFX');

obtaining a total offset in the X direction based on the offset Shift X of the original data in the X direction and the offset Shift X' of the first-order derivative data in the X direction, and obtaining a total offset in the Y direction based on the offset Shift Y of the original data in the Y direction and the offset Shift Y' of the first-order derivative data in the Y direction; and obtaining the compensation value based on the total offset in the X direction and the total offset in the Y direction.

11. The compensation method for exposure alignment of claim 3, wherein performing derivative processing on the original data to obtain the derivative data comprises:

performing first-order derivation on the original data to obtain first-order derivative data; and performing second-order derivation on the first-order derivative data to obtain second-order derivative data as the derivative data, wherein the first data comprises: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with a center of a wafer as an origin, and a coordinate CFY of the original data in the Y direction in the coordinate system with the center of the wafer as the origin, and the second data comprises: a translation amount TRX' of the second-order derivative data in the X direction, a translation amount TRY' of the second-order derivative data in the Y direction, a rotation amount GRX' of the second-order derivative data, an orthogonal amount NOGR' of the second-order derivative data, an amplification amount GMX' of the second-order derivative data in the X direction, an amplification amount GMY' of the second-order derivative data in the Y direction, a coordinate CFX' of the second-order derivative data in the X direction in the coordinate system with the center of the wafer as the origin, and a coordinate CFY' of the second-order derivative data in the Y direction in the coordinate system with the center of the wafer as the origin; and obtaining the compensation value based on the first data and the second data comprises:

respectively obtaining an offset Shift X of the original data in the X direction, an offset Shift Y of the original data in the Y direction, an offset Shift X" of the second-order derivative data in the X direction, and an offset Shift Y" of the second-order derivative data in the Y direction based on following formulas:

Shift_X=(TRX)+(−GRX*CFY)+(−NOGR*CFY)+(GMX*CFX);

Shift_Y=(TRY)+(GRX*CFX)+(GMY*CFY);

Shift_X"=(TRX")+(−GRX"*CFY")+(−NOGR"*CFY")+(GMX"*CFX"); and

Shift_Y"=(TRY")+(GRX"*CFX")+(GMY"*CFY");

obtaining a total offset in the X direction based on the offset Shift X of the original data in the X direction and the offset Shift X" of the second-order derivative data in the X direction, and obtaining a total offset in the Y direction based on the offset Shift Y of the original data in the Y direction and the offset Shift Y" of the second-order derivative data in the Y direction; and obtaining the compensation value based on the total offset in the X direction and the total offset in the Y direction.

12. The compensation method for exposure alignment of claim 3, wherein
performing derivative processing on the original data to obtain the derivative data comprises:
performing first-order derivation on the original data to obtain first-order derivative data; and
performing second-order derivation on the first-order derivative data to obtain second-order derivative data as the derivative data,
wherein the first data comprises: a translation amount TRX of the original data in the X direction, a translation amount TRY of the original data in the Y direction, a rotation amount GRX of the original data, an orthogonal amount NOGR of the original data, an amplification amount GMX of the original data in the X direction, an amplification amount GMY of the original data in the Y direction, a coordinate CFX of the original data in the X direction in a coordinate system with a center of a wafer as an origin, a coordinate CFY of the original data in the Y direction in the coordinate system with the center of the wafer as the origin, an amplification amount FM of an exposure area of the original data, an amplification amount AFM of an asymmetric exposure area of the original data, a rotation amount FR of the exposure area of the original data, a rotation amount AFR of the asymmetric exposure area of the original data, a coordinate IFX of the original data in the X direction in a coordinate system with a center of the exposure area as an origin, and a coordinate IFY of the original data in the Y direction in the coordinate system with the center of the exposure area as the origin, and
the second data comprises: a translation amount TRX" of the second-order derivative data in the X direction, a translation amount TRY" of the second-order derivative data in the Y direction, a rotation amount GRX" of the second-order derivative data, an orthogonal amount NOGR" of the second-order derivative data, an amplification amount GMX" of the second-order derivative data in the X direction, an amplification amount GMY" of the second-order derivative data in the Y direction, a coordinate CFX" of the second-order derivative data in the X direction in the coordinate system with the center of the wafer as the origin, a coordinate CFY" of the second-order derivative data in the Y direction in the coordinate system with the center of the wafer as the origin, an amplification amount FM" of an exposure area of the second-order derivative data, an amplification amount AFM" of an asymmetric exposure area of the second-order derivative data, a rotation amount FR" of the exposure area of the second-order derivative data, a rotation amount AFR" of the asymmetric exposure area of the second-order derivative data, a coordinate t IFX" of the second-order derivative data in the X direction in a coordinate system with a center of the exposure area as an origin, and a coordinate IFY" of the second-order derivative data in the Y direction in the coordinate system with the center of the exposure area as the origin; and obtaining the compensation value based on the first data and the second data comprises:
respectively obtaining an offset Shift X of the original data in the X direction, an offset Shift Y of the original data in the Y direction, an offset Shift X" of the second-order derivative data in the X direction, and an offset Shift Y" of the second-order derivative data in the Y direction based on following formulas:

Shift_X=(TRX)+(−GRX*CFY)+(−NOGR*CFY)+(GMX*CFX)+(FM*IFX)+(AFM*IFX)+(−FR*IFY)+(−AFR*IFY);

Shift_Y=(TRY)+(GRX*CFX)+(GMY*CFY)+(FM*IFY)+(−AFM*IFY)+(FR*IFX)+(−AFR*IFX);

Shift_X"=(TRX")+(−GRX"*CFY")+(−NOGR"*CFY")+(GMX"*CFX")+(FM"*IFX")+(AFM"*IFX")+(−FR"*IFY")+(−AFR"*IFY"); and Shift_Y"=(TRY")+(GRX"*CFX")+(GMY"*CFY")+(FM"*IFY")+(−AFM"*IFY")+(FR"*IFX")+(−AFR"*IFX");

obtaining a total offset in the X direction based on the offset Shift X of the original data in the X direction and the offset Shift X" of the second-order derivative data in the X direction, and obtaining a total offset in the Y direction based on the offset Shift Y of the original data in the Y direction and the offset Shift Y" of the second-order derivative data in the Y direction; and obtaining the compensation value based on the total offset in the X direction and the total offset in the Y direction.

13. A compensation method for exposure alignment, comprising:
acquiring original data of an aligned pattern;
performing derivative processing on the original data to obtain first-order derivative data;
performing second-order derivation on the first-order derivative data to obtain second-order derivative data; and
obtaining a secondary compensation value based on the original data, the first-order derivative data and the second-order derivative data to compensate exposure alignment deviation caused by deformation of the aligned pattern;
wherein the original data comprises a first sine wave and a second sine wave, the first sine wave and the second sine wave have a unique first coincidence point, and the first coincidence corresponds to a waveform center of the aligned pattern in the original data;
the first-order derivative data comprises a third sine wave and a fourth sine wave, the third sine wave and the fourth sine wave have a unique second coincidence point, and the second coincidence point corresponds to a waveform center of the aligned pattern in the derivative data;

after obtaining the derivative data, the method further comprises:

determining whether the first coincidence point and the second coincidence point have a horizontal offset, determining that the aligned pattern is deformed when the first coincidence point and the second coincidence point have the horizontal offset, and determining a deformation amount of the aligned pattern and an impact of the deformation amount of the aligned pattern on the exposure alignment based on a magnitude of the horizontal offset.

14. A compensation system for exposure alignment, comprising:

a data collector, configured to acquire original data of an aligned pattern;

a processor, connected with the data collector and configured to perform derivative processing on the original data to obtain derivative data; and a compensator, connected with the processor and configured to obtain a compensation value based on the original data and the derivative data when exposure alignment has deviation, and compensate the exposure alignment based on the compensation value;

wherein the original data comprises a first sine wave and a second sine wave, the first sine wave and the second sine wave have a unique first coincidence point, and the first coincidence corresponds to a waveform center of the aligned pattern in the original data;

the derivative data comprises a third sine wave and a fourth sine wave, the third sine wave and the fourth sine wave have a unique second coincidence point, and the second coincidence point corresponds to a waveform center of the aligned pattern in the derivative data;

after obtaining the derivative data, the method further comprises:

determining whether the first coincidence point and the second coincidence point have a horizontal offset, determining that the aligned pattern is deformed when the first coincidence point and the second coincidence point have the horizontal offset, and determining a deformation amount of the aligned pattern and an impact of the deformation amount of the aligned pattern on the exposure alignment based on a magnitude of the horizontal offset.

15. The compensation system for exposure alignment of claim 14, further comprising a monitor, connected with the processor and configured to determine whether the exposure alignment has deviation or not based on the original data and the derivative data.

16. The compensation system for exposure alignment of claim 15, further comprising a corrector, connected with the compensator and configured to provide a correction coefficient for the compensator, wherein the compensator is configured to compensate the exposure alignment based on the corrected compensation value.

17. The compensation system for exposure alignment of claim 16, further comprising a verifier, connected with the corrector and configured to verify the exposure alignment of the compensated aligned pattern and adjust the correction coefficient when an overlay alignment error of the compensated aligned pattern is greater than a preset value.

18. The compensation system for exposure alignment of claim 14, further comprising a corrector, connected with the compensator and configured to provide a correction coefficient for the compensator, wherein the compensator is configured to compensate the exposure alignment based on the corrected compensation value.

19. The compensation system for exposure alignment of claim 18, further comprising a verifier, connected with the corrector and configured to verify the exposure alignment of the compensated aligned pattern and adjust the correction coefficient when an overlay alignment error of the compensated aligned pattern is greater than a preset value.

* * * * *